US008471651B2

(12) United States Patent
Huang et al.

(10) Patent No.: US 8,471,651 B2
(45) Date of Patent: Jun. 25, 2013

(54) MICROELECTROMECHANICAL FILTER

(75) Inventors: Tsun-Che Huang, Tainan (TW); Feng-Chia Hsu, Kaohsiung County (TW); Pin Chang, Hsinchu (TW); Chin-Hung Wang, Hsinchu (TW)

(73) Assignee: Industrial Technology Research Institutute, Hsinchu (TW)

( * ) Notice: Subject to any disclaimer, the term of this patent is extended or adjusted under 35 U.S.C. 154(b) by 330 days.

(21) Appl. No.: 12/940,054

(22) Filed: Nov. 5, 2010

(65) Prior Publication Data
US 2012/0062340 A1 Mar. 15, 2012

(30) Foreign Application Priority Data

Sep. 15, 2010 (TW) ................................ 99131228 A

(51) Int. Cl.
*H03H 9/46* (2006.01)
*H03H 9/00* (2006.01)
(52) U.S. Cl.
USPC .......................................... 333/186; 333/197
(58) Field of Classification Search
USPC .................. 333/186, 187, 188, 189, 197, 198
See application file for complete search history.

(56) References Cited

U.S. PATENT DOCUMENTS

| 6,909,221 B2 | 6/2005 | Ayazi et al. | |
|---|---|---|---|
| 7,492,241 B2 | 2/2009 | Piazza et al. | |
| 7,639,105 B2 | 12/2009 | Ayazi et al. | |
| 7,750,759 B1 * | 7/2010 | Lee et al. | 333/186 |
| 7,847,656 B2 * | 12/2010 | Ayazi et al. | 333/187 |
| 7,924,119 B1 * | 4/2011 | Ayazi et al. | 333/186 |
| 8,111,114 B2 * | 2/2012 | Bhave et al. | 333/186 |
| 8,314,665 B2 * | 11/2012 | Mohanty et al. | 333/186 |
| 2006/0125576 A1 | 6/2006 | Ho et al. | |

FOREIGN PATENT DOCUMENTS

TW 200737585 10/2007

OTHER PUBLICATIONS

G. Piazza, Abstract of "Hybrid Ultra-Compact 4th Order Band-Pass Filters Based on Piezoelectric ALN Contour-Mode MEMS Resonators", thesis of University of Pennsylvania, Jun. 1-5, 2008.
G. Piazza, Abstract of "Ultra-Thin Super High Frequency Two-Port ALN Contour-Mode Resonators and Filters", thesis of University of Pennsylvania, Jun. 21-25, 2009.
G. Piazza, Abstract of "A Low-Loss 1.8GHZ Monolithic Thin-Film Piezoelectric-on-Substrate Filter", thesis of University of Pennsylvania, Jun. 1-5, 2008.

* cited by examiner

*Primary Examiner* — Dean O Takaoka
(74) *Attorney, Agent, or Firm* — Jianq Chyun IP Office

(57) ABSTRACT

A microelectromechanical filter is provided. The microelectromechanical filter includes an input electrode, an output electrode, one or several piezoelectric resonators, one or several high quality factor resonators, and one or several coupling beams. The input electrode and the output electrode are disposed on the piezoelectric resonators. The high quality factor resonator is silicon or of piezoelectric materials, and there is no metal electrode on top of the resonator. The coupling beam is connected between the piezoelectric resonator and the high quality factor resonator. The coupling beam transmits an acoustic wave among the resonators, and controls a bandwidth of filter. The microelectromechanical filter with low impedance and high quality factor fits the demand for next-generation communication systems.

18 Claims, 4 Drawing Sheets

MICROELECTROMECHANICAL FILTER

CROSS-REFERENCE TO RELATED APPLICATION

This application claims the priority benefit of Taiwan application serial no. 99131228, filed on Sep. 15, 2010. The entirety of the above-mentioned patent application is hereby incorporated by reference herein and made a part of this specification.

BACKGROUND

1. Technical Field

The disclosure relates to a microelectromechanical filter used for a wireless communication system.

2. Description of Related Art

In a communication system, an acoustic wave filter can be used for extracting a signal to be transmitted and filtering the noises, which is somehow an essential component in the communication system. Regarding a given frequency response, a transfer function of the filter is determined by a quality factor (which is referred to as a Q-value hereinafter). A device loss of a conventional radio frequency (RF) device is increased as a frequency is increased since conductors and media therein are operated under a frequency of GHz. Therefore, a film bulk acoustic wave resonator designed based on structural resonance is gradually used to replace the related device due to its small size, which becomes a main device of a filter used in a mobile phone. If "channel selection filters" are required to satisfy demands of next generation communication systems, the Q-value of the resonator at 1 GHz is required to be higher.

Some conventional resonators have a problem that increasing of the Q-value and decreasing of the impedance cannot be simultaneously achieved, so that a filter with an extremely high Q-value and an impedance low enough cannot be designed. Therefore, it is an important issue to design a filter with an extremely high Q-value and an impedance on demand to match the impedance of the communication system, so as to implement a channel selection filter.

SUMMARY

The disclosure provides a microelectromechanical filter including a first substrate, a second substrate, an input electrode, an output electrode, a first suspended resonator, a second suspended resonator, a piezoelectric resonator, and a coupling beam. The input electrode is disposed on the first substrate. The output electrode is disposed on the second substrate. The first suspended resonator is connected to the first substrate and the second substrate. The second suspended resonator is connected to the first substrate and the second substrate. The piezoelectric resonator is disposed on the first suspended resonator on the top, and an upper electrode of the piezoelectric resonator has an interdigitated pattern. Two sides of the interdigitated pattern are respectively connected to the input electrode and the output electrode, and a first piezoelectric material layer and a first lower electrode are sequentially disposed under the upper electrode of the piezoelectric resonator. The coupling beam is coupled between the first suspended resonator and the second suspended resonator. The coupling beam transmits an acoustic wave and controls a bandwidth of the microelectromechanical filter.

The disclosure provides a microelectromechanical filter including a first piezoelectric region, a second piezoelectric region, an input electrode, an output electrode, a first piezoelectric resonator, a second piezoelectric resonator and a coupling beam. The input electrode is disposed on the first piezoelectric region. The output electrode is disposed on the second piezoelectric region. The first piezoelectric resonator includes an upper electrode, a suspended piezoelectric layer and a first lower electrode. The upper electrode has an interdigitated pattern, and the interdigitated pattern is connected to the input electrode and the output electrode. The suspended piezoelectric layer is disposed under the upper electrode. The suspended piezoelectric layer is connected to the first piezoelectric region and the second piezoelectric region. The first lower electrode is disposed under the suspended piezoelectric layer. The second piezoelectric resonator is connected to the first piezoelectric region and the second piezoelectric region. The coupling beam is coupled between the suspended piezoelectric layer and the second piezoelectric resonator. The coupling beam transmits an acoustic wave and controls a bandwidth of the microelectromechanical filter.

According to another aspect, the disclosure provides a microelectromechanical filter including an input electrode, an output electrode, at least one first resonator and at least one second resonator, wherein the first resonator is a piezoelectric resonator. The first resonator is driven by the input electrode and sensed by the output electrode. The second resonator does not have any metal material. The coupling beam is coupled between the at least one first resonator and the at least one second resonator. The coupling beam transmits an acoustic wave and controls a bandwidth of the microelectromechanical filter.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION

Figure 1:
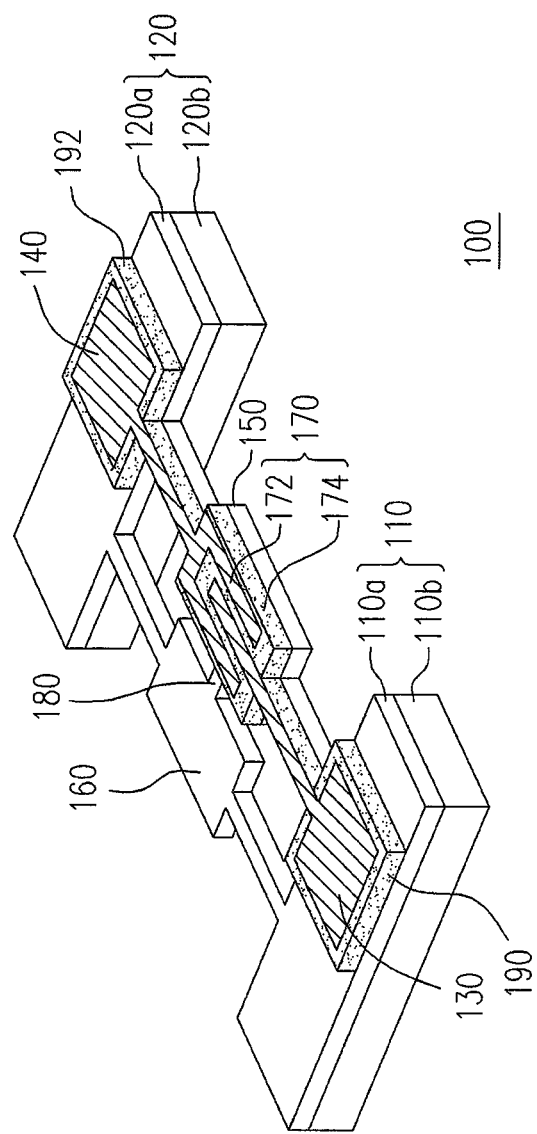
FIG. 1 is a three-dimensional view of a microelectromechanical filter according to a first exemplary embodiment of the disclosure.

The present disclosure will now be described more fully with reference to the accompanying drawings, in which exemplary embodiments of the disclosure are shown. The terms used herein such as "above", "below", "front", "back", "left" and "right" are for the purpose of describing directions in the figures only and are not intended to be limiting of the disclosure. Wherever possible, the same reference numbers are used in the drawings and the description to refer to the same or like parts.

First Exemplary Embodiment

Referring to FIG. 1, FIG. 1 is a three-dimensional view of a microelectromechanical filter according to a first exemplary embodiment of the disclosure. The microelectromechanical filter 100 includes a first substrate 110, a second substrate 120, an input electrode 130, an output electrode 140, a first suspended resonator 150, a second suspended resonator 160, a piezoelectric resonator 170, and a coupling beam 180.

The first substrate 110 and the second substrate 120 are of same material, which is divided into two parts in parallel to form support layers for a plurality of resonators, and is disposed below the first suspended resonator 150 and the second suspended resonator 160. Therefore, the first suspended resonator 150 is connected between the first substrate 110 and the second substrate 120 in a suspending approach to form an "I" shape. Similarly, the second suspended resonator 160 is also connected between the first substrate 110 and the second substrate 120 in the suspending approach to form an "I" shape. The first suspended resonator 150 and the second suspended resonator 160 form a parallel configuration, and thicknesses of the two resonators are substantially the same. The piezoelectric resonator 170 is disposed on the first suspended resonator 150, and is coupled to the first suspended resonator 150 to form a composite resonator. In the composite resonator, a thickness of the piezoelectric resonator 170 is thinner compared to that of the first suspended resonator 150. The composite resonator and the second suspended resonator 160 form a parallel configuration. The coupling beam 180 is coupled between the composite resonator and the second suspended resonator 160.

Shapes of the first suspended resonator 150 and the piezoelectric resonator 170 are consistent, so as to facilitate a close connection there between. Structures of the first suspended resonator 150 and the second suspended resonator 160 are the same or similar. The first suspended resonator 150 is connected between the first substrate 110 and the second substrate 120. The second suspended resonator 160 is also connected between the first substrate 110 and the second substrate 120. Materials of the substrate 110a, the substrate 120a, the first suspended resonator 150, the second suspended resonator 160 and the coupling beam 180 are the same, which can be pure silicon or a silicon on insulator (SOI) semiconductor material. Moreover, the first substrate 110 is SOT, which may include a silicon layer 110a and an oxide layer 110b. The second substrate 120 is SOI, which may include a silicon layer 120a and an oxide layer 120b.

The input electrode 130 is disposed on the first substrate 110. The output electrode 140 is disposed on the second substrate 120. An electric signal can enter the input electrode 130, though cannot pass through the first substrate 110 or the second substrate 120. The input electrode 130 and the output electrode 140 are respectively extended to the top of the composite resonator to form an interdigitated pattern, wherein the input electrode 130 and the output electrode 140 are metal. The piezoelectric resonator 170 can convert the electric signal of the input electrode 130 into mechanical energy to drive the first suspended resonator 150 and transfer the mechanical energy to the second suspended resonator 160 through the coupling beam 180, wherein the mechanical energy is converted back to the electric signal, and the electric signal is output by the output electrode 140.

The piezoelectric resonator 170 has an upper electrode 172, a first piezoelectric material layer 174 and a first lower electrode. The upper electrode 172 of the piezoelectric resonator 170 has the interdigitated pattern. Two sides of the interdigitated pattern are respectively connected to the input electrode 130 and the output electrode 140. The first piezoelectric material layer 174 and the first lower electrode are adjacently disposed under the upper electrode 172, wherein the first lower electrode is disposed between the first piezoelectric material layer 174 and the first suspended resonator 150. Since a thickness of a metal layer of the first lower electrode is extremely thin, the first lower electrode is not illustrated in FIG. 1. FIG. 1 illustrates the upper electrode 172 with three cross-site interdigitated electrode. However, when actually implemented may use many pairs cross-site interdigitated electrode. The interdigitated pattern on the first piezoelectric material layer 174 may have many variations, which is not limited by the disclosure.

In the present exemplary embodiment, since the material of the second suspended resonator 160 can be silicon or a SOI semiconductor material, the second suspended resonator 160 can be a silicon resonator. The material of the second suspended resonator 160 is preferably pure silicon, so that the silicon resonator (the second suspended resonator 160) can achieve a high quality factor.

It should be noticed that the composite resonator includes the first suspended resonator 150 and the piezoelectric resonator 170, and since a metal material is used to form the structure of the piezoelectric resonator 170, the composite resonator may have a low quality factor and low impedance. Moreover, the silicon resonator (the second suspended resonator 160) may have a high quality factor and a high impedance due to its used material and structure.

The silicon resonator (the second suspended resonator 160) does not include a metal material, and is not connected to the input electrode 130 or the output electrode 140. The upper electrode 172 of the piezoelectric resonator 170 is connected to the input electrode 130 or the output electrode 140, so that the electric signal can enter the composite resonator through the input electrode 130 and produce resonance of an acoustic wave within the composite resonator, and after the acoustic wave is converted into the electric signal, the electric signal is output by the output electrode 140. The piezoelectric resonator 170 drives the first suspended resonator 150 closely connected to the piezoelectric resonator 170, and the composite resonator can drive the coupling beam 180 to drive the second suspended resonator 160. Since the coupling beam 180 is coupled between the composite resonator and the silicon resonator (the second suspended resonator 160), the coupling beam 180 drives two resonators and connects different quality factors in series. The coupling beam 180 transmits the acoustic wave between the piezoelectric resonator 170 and the silicon resonator (the second suspended resonator 160) to present an in-phase or out-of-phase resonance state, and controls a bandwidth of the microelectromechanical filter 100. Since the silicon has a small loss for propagating the acoustic wave, the structure of the microelectromechanical filter 100 may have an extremely high quality factor. On the other hand, since the electric signal is input through the piezoelectric resonator 170, an input impedance is extremely low. Therefore, the microelectromechanical filter 100 may have a filtering effect for the acoustic wave, and may simultaneously have features of high quality factor and low input impedance.

According to the above descriptions, the coupling beam 180 influences an in-phase or out-of-phase frequency of the acoustic wave resonance. A size of the coupling beam 180 influences a band-pass bandwidth of the microelectromechanical filter 100. When the coupling beam 180 is designed, a length and a thickness of the coupling beam 180 can be adjusted according to a requirement of the communication system, a quantity and arrangement of the resonators, so that the designed vibration pattern is configured in the required band or bandwidth, so as to achieve a suitable frequency response.

Moreover, the microelectromechanical filter 100 may further include a second piezoelectric material layer 190 and a second lower electrode at a side where the input electrode 130 is located, wherein the second lower electrode is not illustrated due to its extremely thin metal layer. The second piezoelectric material layer 190 is disposed under the input electrode 130, and the second lower electrode is disposed between the second piezoelectric material layer 190 and the first substrate 110. Similarly, the microelectromechanical filter 100 may further include a third piezoelectric material layer 192 and a third lower electrode at a side where the output electrode 140 is located, wherein the third lower electrode is not illustrated due to its extremely thin metal layer. The third piezoelectric material layer 192 is disposed under the output electrode 140, and the third lower electrode is disposed between the third piezoelectric material layer 192 and the second substrate 120. The first piezoelectric material layer 174, the second piezoelectric material layer 190 and the third piezoelectric material layer 192 are connected to form a same piezoelectric material layer. The first, the second and the third lower electrodes are also connected. Several exemplary embodiments are provided below for further descriptions.

Second Exemplary Embodiment

Figure 2:
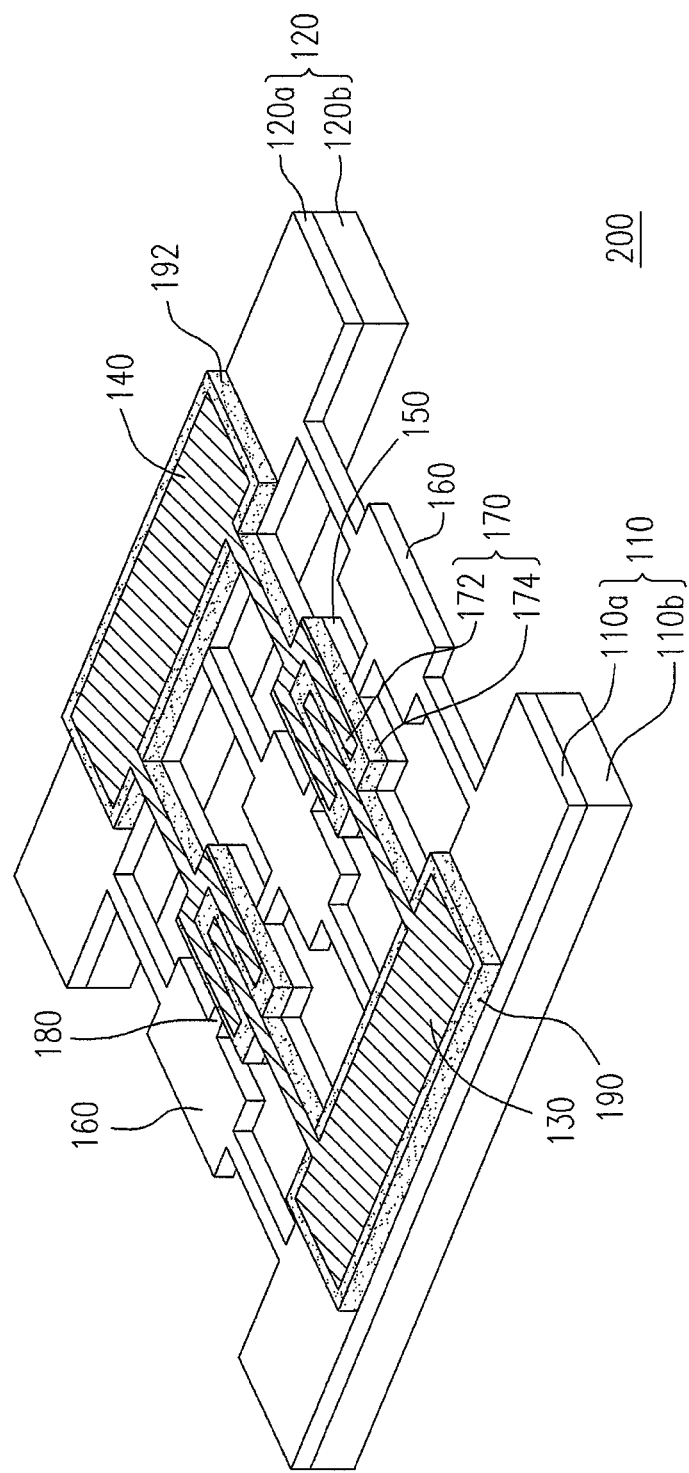
FIG. 2 is a three-dimensional view of a microelectromechanical filter according to a second exemplary embodiment of the disclosure.

Referring to FIG. 2, FIG. 2 is a three-dimensional view of a microelectromechanical filter according to a second exemplary embodiment of the disclosure. A structure of the microelectromechanical filter 200 is similar to that of the aforementioned microelectromechanical filter 100. In the microelectromechanical filter 200, a plurality of coupling beams is used to combine a plurality of piezoelectric resonators and a plurality of silicon resonators. The microelectromechanical filter 200 includes a first substrate 110, a second substrate 120, an input electrode 130, an output electrode 140, a plurality of first suspended resonators 150, a plurality of second suspended resonators 160, a plurality of piezoelectric resonators 170, and a plurality of coupling beams 180. The number of the first suspended resonators 150 is the same as the number of the piezoelectric resonators 170.

The first substrate 110 and the second substrate 120 are of same material layer, which is divided into two parts in parallel to form support layers for a plurality of resonators, and is disposed below the first suspended resonators 150 and the second suspended resonators 160. Therefore, each of the first suspended resonators 150 is connected between the first substrate 110 and the second substrate 120 in a suspending approach to form an "I" shape. Similarly, each of the second suspended resonators 160 is also connected between the first substrate 110 and the second substrate 120 in the suspending approach to form an "I" shape. Each of the first suspended resonators 150 and each of the second suspended resonators 160 form a parallel configuration, and thicknesses of the resonators 150 and 160 are substantially the same. Each of the piezoelectric resonators 170 is disposed on the corresponding first suspended resonator 150, and is closely connected to the first suspended resonator 150 to form a composite resonator. In the composite resonator, a thickness of the piezoelectric resonator 170 is thinner compared to that of the first suspended resonator 150. The coupling beam 180 is coupled between each of the composite resonators and each of the second suspended resonators 160.

Shapes of the first suspended resonator 150 and the piezoelectric resonator 170 are consistent, so as to facilitate a close connection there between. Structures of each of the first suspended resonators 150 and each of the second suspended resonators 160 are the same or similar. Each of the first suspended resonators 150 is connected between the first substrate 110 and the second substrate 120. Each of the second suspended resonators 160 is also connected between the first substrate 110 and the second substrate 120. Materials of the substrate 110a, the substrate 120a, the first suspended resonator 150, the second suspended resonator 160 and the coupling beam 180 are the same, which can be pure silicon or a SOI semiconductor material. Moreover, the first substrate 110 is SOI, which may include a silicon layer 110a and an oxide layer 110b. The second substrate 120 is SOI, which may include a silicon layer 120a and an oxide layer 120b.

The input electrode 130 is disposed above the first substrate 110. The output electrode 140 is disposed above the second substrate 120. An electric signal can enter the input electrode 130, though cannot pass through the first substrate 110 or the second substrate 120. The input electrode 130 and the output electrode 140 are respectively extended to the top of the composite resonator to form an interdigitated pattern, wherein materials of the input electrode 130 and the output electrode 140 are metal. The piezoelectric resonator 170 can convert the electric signal of the input electrode 130 into mechanical energy to drive the first suspended resonator 150 and transfer the mechanical energy to the other suspended resonators through the coupling beams 180, wherein the mechanical energy is converted back to the electric signal, and the electric signal is output by the output electrode 140.

Each of the piezoelectric resonators 170 has an upper electrode 172, a first piezoelectric material layer 174 and a first lower electrode. The upper electrode 172 of each of the piezoelectric resonators 170 has the interdigitated pattern. Two sides of each of the interdigitated patterns are respectively connected to the input electrode 130 and the output electrode 140. The first piezoelectric material layer 174 and the first lower electrode are adjacently disposed under the upper electrode 172, wherein the first lower electrode is disposed between the first piezoelectric material layer 174 and the first suspended resonator 150. Since a thickness of a metal layer of the first lower electrode is extremely thin, the first lower electrode is not illustrated in FIG. 2. In FIG. 2, a left side of the interdigitated pattern of the upper electrode 172 is a first stage, and a right side thereof is a second stage, and the interdigitated shape is only used as an example. The interdigitated pattern on the first piezoelectric material layer 174 may have many variations, which is not limited by the disclosure.

In the present exemplary embodiment, since the material of each of the second suspended resonators 160 is silicon or a SOI semiconductor material, the second suspended resonator 160 can be a silicon resonator. The material of the second suspended resonator 160 is preferably pure silicon, so that the silicon resonator may have a high quality factor.

It should be noticed that the composite resonator includes the first suspended resonator 150 and the piezoelectric resonator 170, and since a metal material is used to form the structure of the piezoelectric resonator 170, the composite resonator may have a low quality factor and a low impedance. Due to acoustic loss of silicon material is lower than metal material; silicon resonators have higher Q-value. Compared to the microelectromechanical filter 100 of FIG. 1, the microelectromechanical filter 200 of FIG. 2 not only has similar functions as that of the microelectromechanical filter 100 of FIG. 1, but also has a higher Q-value.

Each of the silicon resonators 160 does not include a metal material, and is not connected to the input electrode 130 or the output electrode 140. The upper electrode 172 of each of the piezoelectric resonators 170 is connected to the input electrode 130 or the output electrode 140, so that the electric signal can enter each of the piezoelectric resonators 170 through the input electrode 130 and produce resonance of an acoustic wave within each of the piezoelectric resonators 170, and after the acoustic wave is converted into the electric signal, the electric signal is output by the output electrode 140. Since each of the coupling beams 180 is coupled between the piezoelectric resonator 170 and the silicon resonator 160, the coupling beam 180 connects different quality factors in series. The resonance of the acoustic wave within each of the piezoelectric resonators 170 drives the adjacent silicon resonators 160. The coupling beam 180 transmits the acoustic wave between the piezoelectric resonator 170 and the high quality factor resonator 160 to present an in-phase or out-of-phase resonance state, and controls a bandwidth of the microelectromechanical filter 200. Since the silicon has a small loss for propagating the acoustic wave, the structure of the microelectromechanical filter 200 may have an extremely high quality factor. On the other hand, since the acoustic wave is input and output through each of the piezoelectric resonators 170, an input impedance thereof is extremely low. Therefore, the microelectromechanical filter 200 may have a filtering effect for the acoustic wave, and may simultaneously have features of high quality factor and low input impedance.

According to the above descriptions, the coupling beams 180 influence an in-phase or out-of-phase frequency of the acoustic wave resonance. A size of each of the coupling beams 180 influences a band-pass bandwidth of the microelectromechanical filter 200. When the coupling beam 180 is designed, a length and a thickness of the coupling beam 180 can be adjusted according to a requirement of the communication system, so that the designed vibration pattern is configured in the required band or bandwidth, so as to achieve a suitable frequency response.

Moreover, the microelectromechanical filter 200 may further include a second piezoelectric material layer 190 and a second lower electrode at a side where the input electrode 130 is located, wherein the second lower electrode is not illustrated due to its extremely thin metal layer. The second piezoelectric material layer 190 is disposed under the input electrode 130, and the second lower electrode is disposed between the second piezoelectric material layer 190 and the first substrate 110. Similarly, the microelectromechanical filter 200 may further include a third piezoelectric material layer 192 and a third lower electrode at a side where the output electrode 140 is located, wherein the third lower electrode is not illustrated due to its extremely thin metal layer. The third piezoelectric material layer 192 is disposed under the output electrode 140, and the third lower electrode is disposed between the third piezoelectric material layer 192 and the second substrate 120. The first piezoelectric material layer 174, the second piezoelectric material layer 190 and the third piezoelectric material layer 192 are connected to form a same piezoelectric material layer. The first, the second and the third lower electrodes are also connected.

It should be noticed that the microelectromechanical filter 100 of the first exemplary embodiment uses one coupling beam to combine one piezoelectric resonator and one silicon resonator, and the microelectromechanical filter 200 of the second exemplary embodiment uses four coupling beams to combine two piezoelectric resonators and three silicon resonators, wherein the silicon resonator may have high quality factor. Although several possible patterns of the microelectromechanical filter have been described in the above exemplary embodiments, it should be understood by those skilled in the art that designs of the disclosure are not limited to the above possible patterns. In other words, the spirit of the disclosure is met as long as the microelectromechanical filter uses the coupling beam to combine the piezoelectric resonator and the high quality factor resonator, the high quality factor resonator does not contain a metal material and is not connected to the input electrode or the output electrode, and the upper electrode of the piezoelectric resonator is connected to the input electrode or the output electrode. Several exemplary embodiments are provided below to those skilled in the art for a further understanding of the spirit of the disclosure.

Third Exemplary Embodiment

Figure 3:
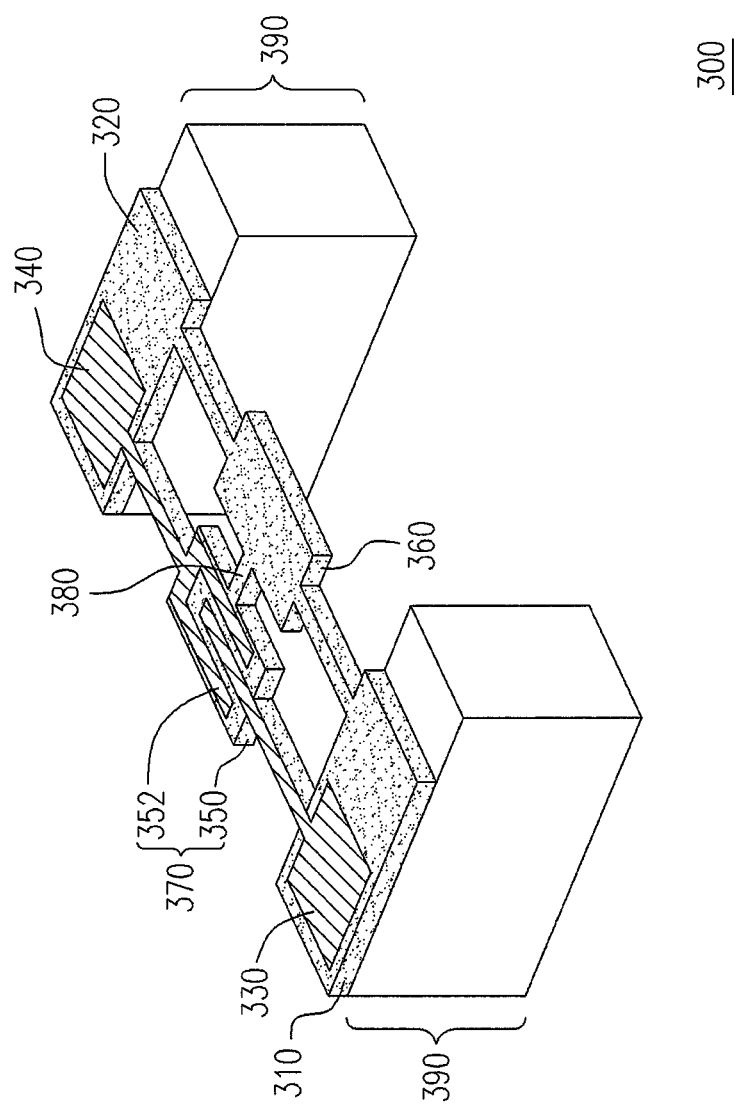
FIG. 3 is a three-dimensional view of a microelectromechanical filter according to a third exemplary embodiment of the disclosure.

Referring to FIG. 3, FIG. 3 is a three-dimensional view of a microelectromechanical filter according to a third exemplary embodiment of the disclosure. The microelectromechanical filter 300 includes a first piezoelectric region 310, a second piezoelectric region 320, an input electrode 330, an output electrode 340, a piezoelectric resonator 370 having an interdigitated electrode, a piezoelectric resonator 360 without the interdigitated electrode, and a coupling beam 380. The piezoelectric resonator 370 includes an upper electrode 352, a suspended piezoelectric layer 350 and a first lower electrode, wherein the piezoelectric resonator 370 does not include a silicon substrate. The first lower electrode is not illustrated due to its extremely thin metal layer.

The first piezoelectric region 310 and the second piezoelectric region 320 are of same material, the two parts are disposed in parallel and are disposed on SOI layers 390, wherein both sides of the microelectromechanical filter 300 have the SOI layer 390 serving as a support layer for a plurality of suspended piezoelectric layers. The suspended piezoelectric layer 350 is connected between the first piezoelectric region 310 and the second piezoelectric region 320 in a suspending approach to form an "I" shape. Similarly, the piezoelectric resonator 360 without the interdigitated electrode is also connected between the first piezoelectric region 310 and the second piezoelectric region 320 in the suspending approach to form an "I" shape. The suspended piezoelectric layer 350 and the piezoelectric resonator 360 form a parallel configuration. The coupling beam 380 is coupled between the suspended piezoelectric layer 350 and the piezoelectric resonator 360. Each of the piezoelectric layers and the coupling beam 380 has the same material.

The input electrode 330 is disposed on the first piezoelectric region 310. The output electrode 340 is disposed on the second piezoelectric region 320. The input electrode 330 and the output electrode 340 are respectively extended to the top of the piezoelectric resonator 370 to form an interdigitated pattern, wherein materials of the input electrode 330 and the output electrode 340 are metal. The piezoelectric resonator 370 can convert the electric signal of the input electrode 330 into mechanical energy to produce resonance, wherein the mechanical energy is converted back to the electric signal, and the electric signal is output by the output electrode 340. The input electrode 330 and the output electrode 340 of the microelectromechanical filter 300 may form an input/output energy conversion interface.

The upper electrode 352 is disposed on the suspended piezoelectric layer 350. The upper electrode 352 has the interdigitated pattern. Two sides of the interdigitated pattern are respectively connected to the input electrode 330 and the output electrode 340. The first lower electrode is disposed under the suspended piezoelectric layer 350. In FIG. 3, a left side of the interdigitated pattern of the upper electrode 352 is a first stage, and a right side thereof is a second stage, and the interdigitated shape is only used as an example. The interdigitated pattern on the suspended piezoelectric layer 350 may have many variations, which is not limited by the disclosure.

Structures of the suspended piezoelectric layer 350 and the piezoelectric resonator 360 can be the same or similar. The suspended piezoelectric layer 350 is connected to the first piezoelectric region 310 and the second piezoelectric region 320. The piezoelectric resonator 360 is connected to the first piezoelectric region 310 and the second piezoelectric region 320. The aforementioned various piezoelectric layers can be the same piezoelectric thin film layer.

It should be noticed that since the material of the piezoelectric resonator 360 is the piezoelectric material without including a metal material, the piezoelectric resonator 360 may have a high quality factor. Since the metal material is used to form the structure of the piezoelectric resonator 370 having the interdigitated electrode, the piezoelectric resonator 370 may have a low quality factor and a low impedance.

The piezoelectric resonator 360 does not include a metal material, and is not connected to the input electrode 330 or the output electrode 340. The upper electrode 352 of the piezoelectric resonator 370 is connected to the input electrode 330 or the output electrode 340, so that the electric signal can enter the piezoelectric resonator 370 through the input electrode 330 and produce resonance of an acoustic wave within the piezoelectric resonator 370, and after the acoustic wave is converted into the electric signal, the electric signal is output by the output electrode 340. The piezoelectric resonator 370 drives the coupling beam 380 to drive the piezoelectric resonator 360. Since the coupling beam 380 is coupled between the piezoelectric resonator 370 and the high quality factor resonator (the piezoelectric resonator 360), the coupling beam 380 drives two resonators and connects different quality factors in series. The acoustic wave resonance within the piezoelectric resonator 370 may drive the adjacent high quality factor resonator (the piezoelectric resonator 360). The coupling beam 380 transmits the acoustic wave between the piezoelectric resonator 370 and the high quality factor resonator (the piezoelectric resonator 360) to present an in-phase or out-of-phase resonance state, and controls a bandwidth of the microelectromechanical filter 300. Since the silicon has a small loss for propagating the acoustic wave, the structure of the microelectromechanical filter 300 may have an extremely high quality factor. On the other hand, since the acoustic wave is input and output through the piezoelectric resonator 370, an input impedance is extremely low. Therefore, the microelectromechanical filter 300 may have a filtering effect for the input signal, and may simultaneously have features of high quality factor and low input impedance.

According to the above descriptions, the coupling beam 380 influences an in-phase or out-of-phase frequency of the acoustic wave resonance. A size of the coupling beam 380 influences a band-pass bandwidth of the microelectromechanical filter 300. When the coupling beam 380 is designed, a length and a thickness of the coupling beam 380 can be adjusted according to a requirement of the communication system, so that the designed vibration pattern is configured in the required band or bandwidth, so as to achieve a suitable frequency response.

Moreover, the microelectromechanical filter 300 may further include a second lower electrode at a side where the input electrode 330 is located, wherein the second lower electrode is not illustrated due to its extremely thin metal layer. The second lower electrode is disposed under the first piezoelectric region 310, and is connected to the first lower electrode. Similarly, the microelectromechanical filter 300 may further include a third lower electrode at a side where the output electrode 340 is located, wherein the third lower electrode is not illustrated due to its extremely thin metal layer. The third lower electrode is disposed under the second piezoelectric region 320, and is connected to the first lower electrode. Moreover, the SOI layers 390 are disposed under the second and the third lower electrodes. Another exemplary embodiment is provided below for further description.

Fourth Exemplary Embodiment

Figure 4:
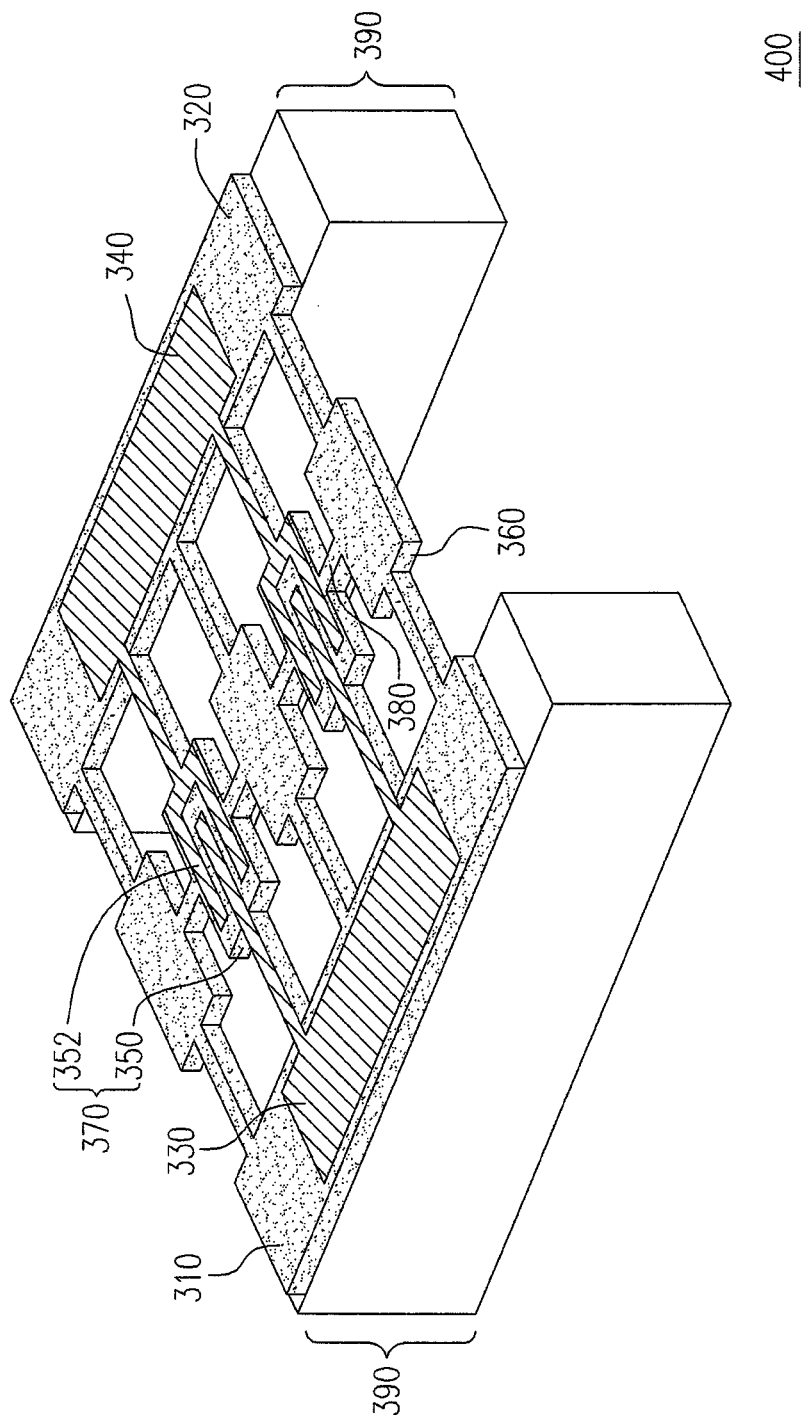
FIG. 4 is a three-dimensional view of a microelectromechanical filter according to a fourth exemplary embodiment of the disclosure.

Referring to FIG. 4, FIG. 4 is a three-dimensional view of a microelectromechanical filter according to a fourth exemplary embodiment of the disclosure. The microelectromechanical filter 400 is similar to the aforementioned microelectromechanical filter 300. In the microelectromechanical filter 400, a plurality of coupling beams is used to combine a plurality of piezoelectric resonators and a plurality of high quality factor resonators (the piezoelectric resonators 360). The microelectromechanical filter 400 includes a first piezoelectric region 310, a second piezoelectric region 320, an input electrode 330, an output electrode 340, a plurality of piezoelectric resonators 370 having interdigitated electrodes, a plurality of piezoelectric resonators 360 without the interdigitated electrode, and a plurality of coupling beams 380. The piezoelectric resonator 370 includes an upper electrode 352, a suspended piezoelectric layer 350 and a first lower electrode, wherein the piezoelectric resonator 370 does not include a silicon substrate. The first lower electrode is not illustrated due to its extremely thin metal layer.

The first piezoelectric region 310 and the second piezoelectric region 320 are of same material, the two parts are disposed in parallel and are disposed on SOI layers 390, wherein both sides of the microelectromechanical filter 400 have the SOI layer 390 serving as a support layer for a plurality of suspended piezoelectric layers. Each of the suspended piezoelectric layers 350 is connected between the first piezoelectric region 310 and the second piezoelectric region 320 in a suspending approach to form an "I" shape. Similarly, each of the piezoelectric resonators 360 is also connected between the first piezoelectric region 310 and the second piezoelectric region 320 in the suspending approach to form an "I" shape. Each of the suspended piezoelectric layers 350 and each of the piezoelectric resonators 360 form a parallel configuration. The coupling beam 380 is coupled between the suspended piezoelectric layer 350 and the piezoelectric resonator 360. Each of the piezoelectric layers and the coupling beam 380 has the same material.

The input electrode 330 is disposed on the first piezoelectric region 310. The output electrode 340 is disposed on the second piezoelectric region 320. The input electrode 330 and the output electrode 340 are respectively extended to the top of each of the piezoelectric resonators 370 to form an interdigitated pattern, wherein materials of the input electrode 330 and the output electrode 340 are metal. The piezoelectric resonator 370 can convert the electric signal of the input electrode 330 into mechanical energy to produce resonance, wherein the mechanical energy is converted back to the electric signal, and the electric signal is output by the output electrode 340. The input electrode 330 and the output electrode 340 of the microelectromechanical filter 400 may form an input/output energy conversion interface.

The upper electrode 352 of each of the piezoelectric resonators 370 has the interdigitated pattern. The upper electrode 352 is disposed on the suspended piezoelectric layer 350. Two sides of each of the interdigitated patterns are respectively connected to the input electrode 330 and the output electrode 340. The first lower electrode is disposed under the suspended piezoelectric layer 350. In FIG. 4, a left side of the interdigitated pattern of the upper electrode 352 is a first stage, and a right side thereof is a second stage, and the interdigitated shape is only used as an example. The interdigitated pattern on the suspended piezoelectric layer 350 may have multistage overlapping variations, which is not limited by the disclosure.

Structures of each of the suspended piezoelectric layers 350 and each of the piezoelectric resonators 360 can be the same or similar. Each of the suspended piezoelectric layers 350 is connected to the first piezoelectric region 310 and the second piezoelectric region 320. Each of the piezoelectric resonators 360 is connected to the first piezoelectric region 310 and the second piezoelectric region 320. The aforementioned various piezoelectric layers can be the same piezoelectric thin film layer.

It should be noticed that since the material of each of the piezoelectric resonators 360 is the piezoelectric material without including a metal material, each of the piezoelectric resonators 360 may have a high quality factor. Since the metal material is used to form the structure of each of the piezoelectric resonators 370, the piezoelectric resonator 370 may have a low quality factor and a low impedance. Compared to the microelectromechanical filter 300 of FIG. 3, the microelectromechanical filter 400 of FIG. 4 not only has similar functions as that of the microelectromechanical filter 300 of FIG. 3, but also has a higher Q-value.

Each of the piezoelectric resonators 360 does not include a metal material, and is not connected to the input electrode 330 or the output electrode 340. The upper electrode 352 of each of the piezoelectric resonators 370 is connected to the input electrode 330 or the output electrode 340, so that the electric signal can enter the piezoelectric resonator 370 through the input electrode 330 and produce resonance of an acoustic wave within the piezoelectric resonator 370, and after the acoustic wave is converted into the electric signal, the electric signal is output by the output electrode 340. The piezoelectric resonator 370 drives the coupling beam 380 to drive the piezoelectric resonator 360. Since the coupling beam 380 is coupled between the piezoelectric resonator 370 and the high quality factor resonator (the piezoelectric resonator 360), the coupling beam 380 connects different quality factors in series. The acoustic wave resonance within each of the piezoelectric resonators 370 may drive the adjacent high quality factor resonators (the piezoelectric resonators 360). The coupling beam 380 transmits the acoustic wave between the piezoelectric resonator 370 and the high quality factor resonator (the piezoelectric resonator 360) to present an in-phase or out-of-phase resonance state, and controls a bandwidth of the microelectromechanical filter 400. Since the silicon has a small loss for propagating the acoustic wave, the structure of the microelectromechanical filter 400 may have an extremely high quality factor. On the other hand, since the acoustic wave is input and output through each of the piezoelectric resonators 370, an input impedance is extremely low. Therefore, the microelectromechanical filter 400 may have a filtering effect for the input signal, and may simultaneously have features of high quality factor and low input impedance.

According to the above descriptions, the coupling beam 380 influences an in-phase or out-of-phase frequency of the acoustic wave resonance. A size of the coupling beam 380 influences a band-pass bandwidth of the microelectromechanical filter 400. When the coupling beam 380 is designed, a length and a thickness of the coupling beam 380 can be adjusted according to a requirement of the communication system, so that the designed vibration pattern is configured in the required band or bandwidth, so as to achieve a suitable frequency response.

Moreover, the microelectromechanical filter 400 may further include a second lower electrode at a side where the input electrode 330 is located, wherein the second lower electrode is not illustrated due to its extremely thin metal layer. The second lower electrode is disposed under the first piezoelectric region 310, and is connected to the first lower electrode. Similarly, the microelectromechanical filter 400 may further include a third lower electrode at a side where the output electrode 340 is located, wherein the third lower electrode is not illustrated due to its extremely thin metal layer. The third lower electrode is disposed under the second piezoelectric region 320, and is connected to the first lower electrode. Moreover, the SOI layers 390 are disposed under the second and the third lower electrodes.

It should be noticed that since the microelectromechanical filters of the aforementioned exemplary embodiments have a higher Q-value and a low input impedance compared to that of the conventional filter, the microelectromechanical filters can be used in devices requiring a high Q-value, for example, wireless communication products such as mobile phones, wireless networks, etc., or can be used to replace film bulk acoustic wave resonators or surface acoustic wave resonators used in some mobile phones, or can be used for impedance matching communication of a communication system, or can be used to select the required frequency band to implement a channel selection filter, so as to achieve a seamless communication system.

According to the above descriptions, in the microelectromechanical filters of the disclosure, the resonators with different Q-values are coupled through mechanical structures to obtain a high quality factor bandpass filter close to a system specification. Therefore, within a high frequency range of dozens MHz to several GHz, the microelectromechanical filters of the disclosure can be applied to communication systems of different frequency bands, so as to avoid a limitation of the conventional technique and satisfy demands of next generation communication systems. Therefore, the disclosure can provide a filter design having an industrial utilization value and having significant practicability and progressiveness.

In summary, in the microelectromechanical filter of the disclosure, the resonators with different Q-values are coupled through mechanical structures, and the resonator with a low quality factor and a low impedance is selected to serve as an input/output terminal, so as to increase the Q-value and decrease the impedance, and accordingly resolve the problem of the conventional technique. The microelectromechanical filter of the disclosure have at least the following features: (1) the microelectromechanical filter is applicable for a frequency range from intermediate frequency to high frequency, (2) the microelectromechanical filter has a low input impedance, which matches the impedance of the communication system, and (3) the microelectromechanical filter has a high quality factor.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A microelectromechanical filter, comprising:
a first substrate;

a second substrate;

an input electrode, disposed on the first substrate;

an output electrode, disposed on the second substrate;

a first suspended resonator, connected to the first substrate and the second substrate;

a second suspended resonator, connected to the first substrate and the second substrate;

a piezoelectric resonator, disposed on the first suspended resonator, wherein the piezoelectric resonator having an upper electrode with an interdigitated pattern, two sides of the interdigitated pattern being respectively connected to the input electrode and the output electrode, and a first piezoelectric material layer and a first lower electrode being disposed under the upper electrode of the piezoelectric resonator; and a coupling beam, coupled between the first suspended resonator and the second suspended resonator, for transmitting an acoustic wave, and controlling a bandwidth of the microelectromechanical filter.

2. The microelectromechanical filter as claimed in claim 1, wherein the input electrode and the output electrode are metal.

3. The microelectromechanical filter as claimed in claim 1, wherein the second suspended resonator is silicon or a silicon on insulator (SOI) semiconductor material.

4. The microelectromechanical filter as claimed in claim 1, wherein the first substrate and the second substrate are silicon or a silicon on insulator (SOI) semiconductor material.

5. The microelectromechanical filter as claimed in claim 1, wherein the coupling beam is silicon or a silicon on insulator (SOI) semiconductor material.

6. The microelectromechanical filter as claimed in claim 1, further comprises a second piezoelectric material layer and a second lower electrode, wherein the second piezoelectric material layer is disposed under the input electrode, and the second lower electrode is disposed between the second piezoelectric material layer and the first substrate.

7. The microelectromechanical filter as claimed in claim 1, further comprises a third piezoelectric material layer and a third lower electrode, wherein the third piezoelectric material layer is disposed under the output electrode, and the third lower electrode is disposed between the third piezoelectric material layer and the second substrate.

8. A microelectromechanical filter, comprising:

a first piezoelectric region;

a second piezoelectric region;

an input electrode, disposed on the first piezoelectric region;

an output electrode, disposed on the second piezoelectric region;

a first piezoelectric resonator, comprising:

an upper electrode, having an interdigitated pattern, wherein the interdigitated pattern is connected to the input electrode and the output electrode;

a suspended piezoelectric layer, disposed under the upper electrode, and connected to the first piezoelectric region and the second piezoelectric region; and a first lower electrode, disposed under the suspended piezoelectric layer;

a second piezoelectric resonator, connected to the first piezoelectric region and the second piezoelectric region; and a coupling beam, coupled between the suspended piezoelectric layer and the second piezoelectric resonator, for transmitting an acoustic wave, and controlling a bandwidth of the microelectromechanical filter.

9. The microelectromechanical filter as claimed in claim 8, wherein the input electrode and the output electrode are metal.

10. The microelectromechanical filter as claimed in claim 8, wherein the second piezoelectric resonator is a piezoelectric material without comprising any metal material.

11. The microelectromechanical filter as claimed in claim 8, wherein the coupling beam is a piezoelectric material.

12. The microelectromechanical filter as claimed in claim 8, further comprises a second lower electrode, wherein the second lower electrode is disposed under the first piezoelectric region, and is connected to the first lower electrode.

13. The microelectromechanical filter as claimed in claim 8, further comprises a third lower electrode, wherein the third lower electrode is disposed under the second piezoelectric region, and is connected to the first lower electrode.

14. A microelectromechanical filter, comprising:

an input electrode;

an output electrode;

at least one first resonator, coupled between the input electrode and the output electrode, wherein the first resonator is driven by the input electrode and sensed by the output electrode;

at least one second resonator, wherein the second resonator does not comprise any metal material and the second resonator is not coupled between the input electrode or the output electrode; and at least one coupling beam, coupled between the at least one first resonator and the at least one second resonator, for transmitting an acoustic wave among the at least one first resonator and the at least one second resonator, and controlling a bandwidth of the microelectromechanical filter.

15. The microelectromechanical filter as claimed in claim 14, wherein the first resonator is a piezoelectric resonator.

16. The microelectromechanical filter as claimed in claim 14, wherein the input electrode and the output electrode are metal.

17. The microelectromechanical filter as claimed in claim 14, wherein a coupling beam is silicon, oxide-silicon or of a piezoelectric material.

18. The microelectromechanical filter as claimed in claim 14, wherein the first resonator comprises an upper electrode, a piezoelectric material layer and a lower electrode, wherein the upper electrode has an interdigitated pattern connected to the input electrode and the output electrode, and the piezoelectric material layer and the lower electrode are disposed under the interdigitated pattern.

* * * * *

UNITED STATES PATENT AND TRADEMARK OFFICE
CERTIFICATE OF CORRECTION

PATENT NO. : 8,471,651 B2  Page 1 of 1
APPLICATION NO. : 12/940054
DATED : June 25, 2013
INVENTOR(S) : Huang et al.

It is certified that error appears in the above-identified patent and that said Letters Patent is hereby corrected as shown below:

On the Title Page, the item (73) Assignee's Name
"Industrial Technology Research Institutute" should be changed to --Industrial Technology Research Institute--.

Signed and Sealed this
Twenty-second Day of October, 2013

Teresa Stanek Rea
*Deputy Director of the United States Patent and Trademark Office*